(12) United States Patent
Dimitriu

(10) Patent No.: US 10,091,031 B1
(45) Date of Patent: Oct. 2, 2018

(54) APPARATUS HAVING A DATA RECEIVER WITH A REAL TIME CLOCK DECODING DECISION FEEDBACK EQUALIZER

(71) Applicant: Micron Technology, Inc., Boise, ID (US)

(72) Inventor: Dragos Dimitriu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/664,506

(22) Filed: Jul. 31, 2017

(51) Int. Cl.
*H03K 5/159* (2006.01)
*H04L 25/03* (2006.01)
*H04L 7/00* (2006.01)

(52) U.S. Cl.
CPC ...... *H04L 25/03057* (2013.01); *H04L 7/0079* (2013.01)

(58) Field of Classification Search
CPC ............ H04L 25/0272; H04L 25/4902; H04L 25/03957; H04L 2015/0349
USPC ................ 375/233, 229; 365/145, 203, 226; 708/322, 323
See application file for complete search history.

(56) References Cited

U.S. PATENT DOCUMENTS

| | | | | |
|---|---|---|---|---|
| 9,390,769 B1* | 7/2016 | Bhatsoori | ............... | G11C 7/065 |
| 9,754,642 B2* | 9/2017 | Takagiwa | ............... | G11C 7/106 |
| 2014/0003160 A1* | 1/2014 | Trivedi | .................... | G11C 7/12 |
| | | | | 365/189.02 |
| 2014/0176193 A1* | 6/2014 | De Vita | ............... | H03K 5/2481 |
| | | | | 327/56 |

OTHER PUBLICATIONS

Schinkel, Daniel, et al., "ISSCC 2007 / Session 17 / Analog Techniques and PLLs /173", IEEE11 International Solid-State Circuits Conference, (2007), 3 pgs.

* cited by examiner

*Primary Examiner* — Khai Tran
(74) *Attorney, Agent, or Firm* — Schwegman Lundberg & Woessner, P.A.

(57) ABSTRACT

Various embodiments include apparatus and methods having a data receiver with a real time clock decoding decision feedback equalizer. In various embodiments, a digital decision feedback loop can be implemented in a data receiver circuit, while all analog signals involved are static relative to the input signal data rate. The implemented data receiver circuit can include a number of data latches with different, but static, analog unbalances and a decision-based clock decoder. In an example, the analog unbalances may be different reference voltages. The decision-based clock decoder can be structured to activate only one data latch, the one with the desired analog unbalance. The outputs of the latches attached to the same clock decoder can be combined such that only the active latch drives the final output. Additional apparatus, systems, and methods are disclosed.

19 Claims, 7 Drawing Sheets

APPARATUS HAVING A DATA RECEIVER WITH A REAL TIME CLOCK DECODING DECISION FEEDBACK EQUALIZER

BACKGROUND

Current low power double data rate fourth-generation (LPDDR4) random access memory (RAM) is expected to support data rates up to 4266 Mbps using 2133 MHz clock frequency. The design of the input data latches is important for achieving this performance level. Challenges include relatively low power supply levels and minuscule input signal energy. Inter-symbol interference (ISI) caused by lossy routes, reflections due to characteristic impedance discontinuities, and crosstalk between parallel signal lines, as well as clock jitter, degrade an input signal to the point that an input data latch should resolve pulses of less than 80 ps by 50 mV. Traditional sense-amplifier latches already have difficulties operating under these conditions and show relatively poor rank margin tool (RMT) margins. An option for input data latches is to use decision feedback equalization (DFE). Typical low overhead DFE receiver implementations involve an analog loop, which applies the feedback to either the input or the reference voltage. The speed of these receivers is limited by the bandwidth and latency of the analog feedback.

DETAILED DESCRIPTION

Figure 1:
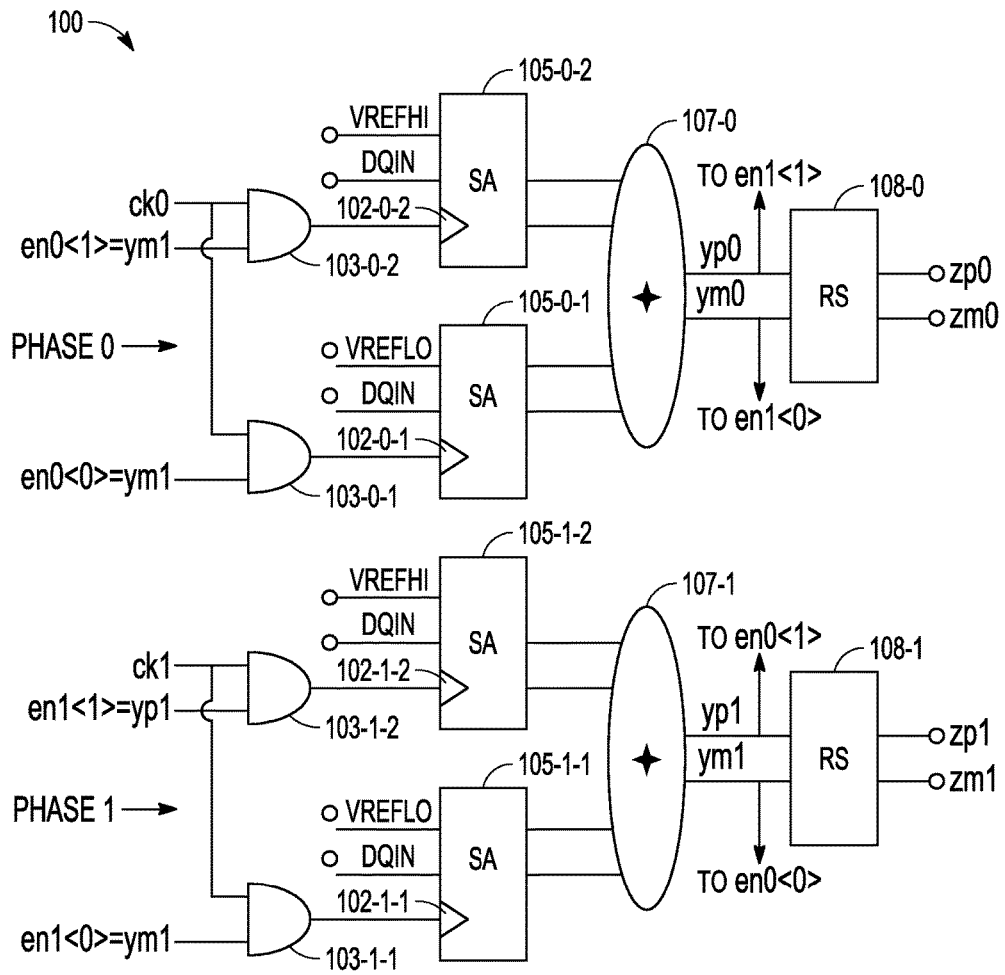
FIG. 1 is a schematic of a two-phase, one-tap decision feedback equalization circuit, according to various embodiments.

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

An option for input data latches is to use decision feedback equalization (DFE). Typical low overhead DFE receiver implementations involve an analog loop, which applies the feedback to either an input or a reference voltage. The speed of these receivers is limited by the bandwidth and latency of the analog feedback. In various embodiments, a multi-tap DFE capable input data latch can be implemented. Such functional input data latches can be developed as a replacement for circuits in LPDDR4 and double data rate fifth-generation (DDR5) memory devices.

In various embodiments, a minimal length digital decision feedback loop is implemented in a data receiver circuit, while all analog signals involved are static relative to the input signal data rate. Such an approach can be implemented for a clocked receiver. The implemented clocked receiver can include a number of identical data latches with different, but static, analog unbalances and a decision-based clock decoder. In particular, the analog unbalances may be different reference voltages. Unlike a loop unrolled solution, the decision-based clock decoder activates only one data latch, the one with the desired analog unbalance such as a reference voltage. The outputs of the latches attached to the same clock decoder can be combined such that only the active latch drives the final output. In a loop unrolling technique, all of the set of latches fire and a decision is made with respect to the final output.

Closing the timing in the feedback loop can be a challenge for designing low overhead DFE receivers. In an embodiment, having all high speed moving parts of the decision feedback loop driven by a few simple CMOS gates can guarantee optimal performance for a given process. For example, process variability has no direct effect on performance, as long as the digital feedback signal goes around the feedback loop in one unit interval (UI), which can also be referred to as a unit of information. A unit interval can correspond to one bit period. The exponential growth of the number of circuits may prevent using this solution for solving more than two or three taps in real time. Higher order taps may be solved by other architectures that can use the real-time receiver, as taught herein, to get feedback loop time relief.

In order to improve RMT margins, channel equalization can be included. The issue will be more acute considering even higher speeds, for example 6400 Mbs for LPDDR5 and DDR5. Pre-emphasis may be used in drivers, while continuous-time linear equalization (CTLE) for preamps or DDR4 type input buffers. For DDR5 input data latches, the natural option can be DFE.

FIG. 1 is a schematic of a 2-phase, 1-tap DFE circuit 100. Phase 0 and Phase 1 of DFE circuit 100 can have almost identical architectural layouts. Phase 0 of DFE circuit 100 is arranged to receive a clock, ck0, an input data signal, DQIN, enable signals en0<1> and en0<0>, a voltage reference for a high condition associated with a bit, VREFHI, a voltage reference for a low condition associated with another bit, VREFLO. Phase 1 of DFE circuit 100 is arranged to receive another clock, ck1, the input data signal, DQIN, enable signals en1<1> and en1<0>, the voltage reference for the high condition associated with a bit, VREFHI, the voltage reference for the low condition associated with the other bit, VREFLO. Ck0 is a phase zero clock signal and ck1 is a phase one clock signal. Ck1 can be the complement of ck0. The clocks ck0 and ck1 provide the 2-phase characteristic of this circuit.

Each phase has two data latches, each comparing the input signal to either VREFHI or VREFLO reference voltages. Phase 0 has data latch 105-0-1 and data latch 105-0-2, while phase 1 has data latch 105-1-1 and data latch 105-1-2. The data latches may be realized as sense amplifiers (SAs). Only one data latch per phase is clocked at a time and the decision is based on the value of the previous bit. The approach with respect to the previous bit is to capture the current bit using VREFLO if the previous bit was low, or capture the current bit using VREFHI if the previous bit was high.

In the phase 0 section, the outputs of data latch 105-0-1 and data latch 105-0-2 are wired together at 107-0, providing a wired "or" resulting in return-to-zero outputs yp0 and ym0. The output signals yp0 and ym0 can be complements of each other. In the phase 1 section, the outputs of data latch 105-1-1 and data latch 105-1-2 are wired together at 107-1, providing a wired "or" resulting in outputs yp1 and ym1. The output signals yp1 and ym1 can be complements of each other. The output (yp0, ym0) and the output (yp1, ym1) can be fed back to the inputs of phase 1 and phase 0, respectively.

Return-to-zero outputs of the two data latches 105-0-1 and 105-0-2, which are part of the same phase (phase 0), are combined such that only the clocked data latch drives the set-reset (RS) latch 108-0, which restores the real digital levels, zp0 and zm0, which are the complementary digital versions of the analog input DQIN. Likewise, return-to-zero outputs of the two data latches 105-1-1 and 105-1-2, which are part of the same phase (phase 1), are combined such that only the clocked data latch drives the set-reset (RS) latch 108-1, which restores the real digital levels, zp1 and zm1, which are the complementary digital versions of the analog input DQIN. Operating at high speed is important for this circuit. In order to minimize the length of the DFE loop, the combined return-to-zero signals from the other phase are used to gate the clock for the current phase. Signals yp1 and ym1 of phase 1 are used to gate clock ck0 of phase 0, while signals yp0 and ym0 of phase 0 are used to gate clock ck1 of phase 1.

Signal yp1 is fed back to env0<1>, which provides input to AND gate 103-0-2 along with ck0 providing input to AND gate 103-0-2, where the output of AND gate 103-0-2 is coupled to an enable input 102-0-2 of data latch 105-0-2. Signal ym1 is fed back to env0<0>, which provides input to AND gate 103-0-1 along with ck0 providing input to AND gate 103-0-1, where the output of AND gate 103-0-1 is coupled to an enable input 102-0-1 of data latch 105-0-1. Signal yp0 is fed back to env1<1>, which provides input to AND gate 103-1-2 along with ck1 providing input to AND gate 103-1-2, where the output of AND gate 103-1-2 is coupled to an enable input 102-1-2 of data latch 105-1-2. Signal ym0 is fed back to env1<0>, which provides input to AND gate 103-1-1 along with ck1 providing input to AND gate 103-1-1, where the output of AND gate 103-1-1 is coupled to an enable input 102-1-1 of data latch 105-1-1. The DFE feedback loop can be structured such the time from input to an enable of a phase 1 data latch to feedback input to an enable of a phase 0 data latch is less than one unit interval.

For DDR5 specifications, recent discussions have mentioned output stage power supply voltage (VDDQ) termination, at least 4800 Mbs per pin for nominal power supply voltage of 1.1 V and input capacitance (CIO) reduced to 1 pF. One notable difference from DDR4 is a non-matched data capturing scheme, similar to LPDDR4 or to graphics double data rate fifth-generation (GDDR5). The DRAM only has data strobe (DQS) clock distribution with no data path matching it. This architecture allows using high speed and high gain clocked input latches, instead of the continuous time input buffers used in DDR4. The input latches may be placed close to the pad, thus eliminating frequency limiting circuits or routing. One characteristic of the non-matched scheme is the shift of a setup/hold window. This shift can be calibrated by the system on a chip (SOC) during training stage.

Figure 2:
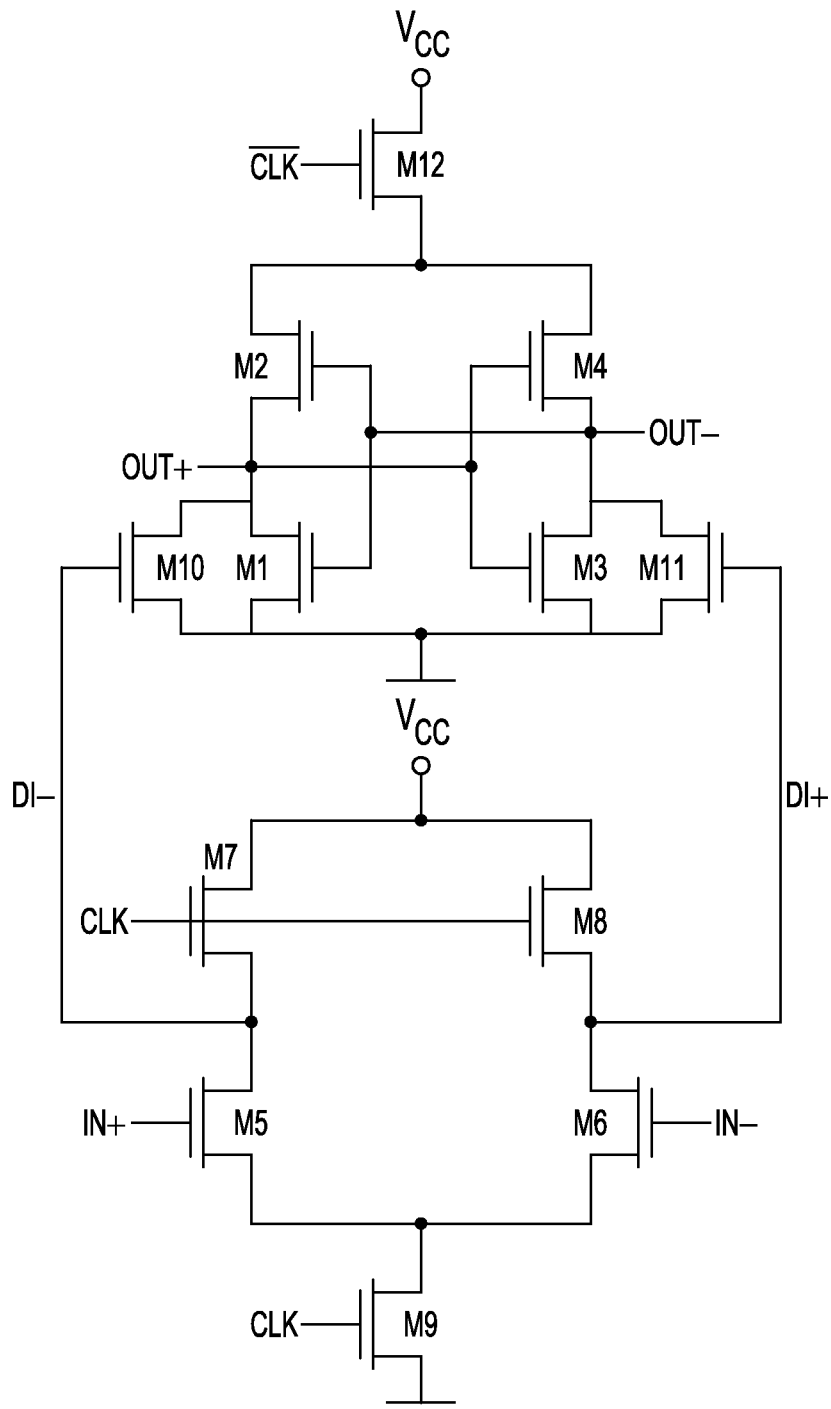
FIG. 2 is a schematic of an example of a dual-tail latch that can be used to implement the sense amplifier (SA) data latches of FIG. 1, according to various embodiments.

In conventional approaches, a strong arm latch or voltage mode sense-amplifier latch is a preferred input data latch used in recent DRAM designs having unmatched data capturing schemes. Such latches are fast, have high input impedance, full swing output, and no static power consumption. One disadvantage of the strong arm latch is the high voltage headroom required by its 4-device stack. This is problematic for 20 nm, and below, technologies. Rather than the strong arm latch, a double-tail SA latch can be used. The double-tail SA latch has two 3-device stacks which allows operation at lower supply voltages. Also, the two stage architecture simplifies combination of the outputs of latches from the same phase. FIG. 2 is an example of a double-latch latch that can be implemented in the SA latches of FIG. 1. The double-tail latch includes an input stage and a latching stage coupled by Di− and Di+ nodes. For further discussion of the double-latch latch of FIG. 2, see D. Schinkel, E. Mensink, E. Klumperink, E. van Tuijl, and B. Nauta, "A Double-Tail Latch-Type Voltage Sense Amplifier," IEEE International Solid-State Circuits Conference (ISSCC), vol. 17, ANALOG TECHNIQUES AND PLLs, p. 314, 2007.

A DFE receiver can be built using dual-tail latches, such as dual-tail SA latches. Combining the outputs of multiple dual-tail data latches as implemented by the DFE circuit of FIG. 1 can be achieved by sharing a second stage. In the same time, each first stage may have an independent reference voltage Vref. The double-tail latch is simple and relatively compact, which is useful in the case of multiple phases and taps. If clock is gated by separate enable signals, a very fast multiplexer can be implied in front of the receiver. The DFE algorithm can then be implemented by decoding the clock enable signals based on previous bits (yp0, ym0, yp1, ym1) and comparing the input signal to predefined Vref signals.

Figure 3:
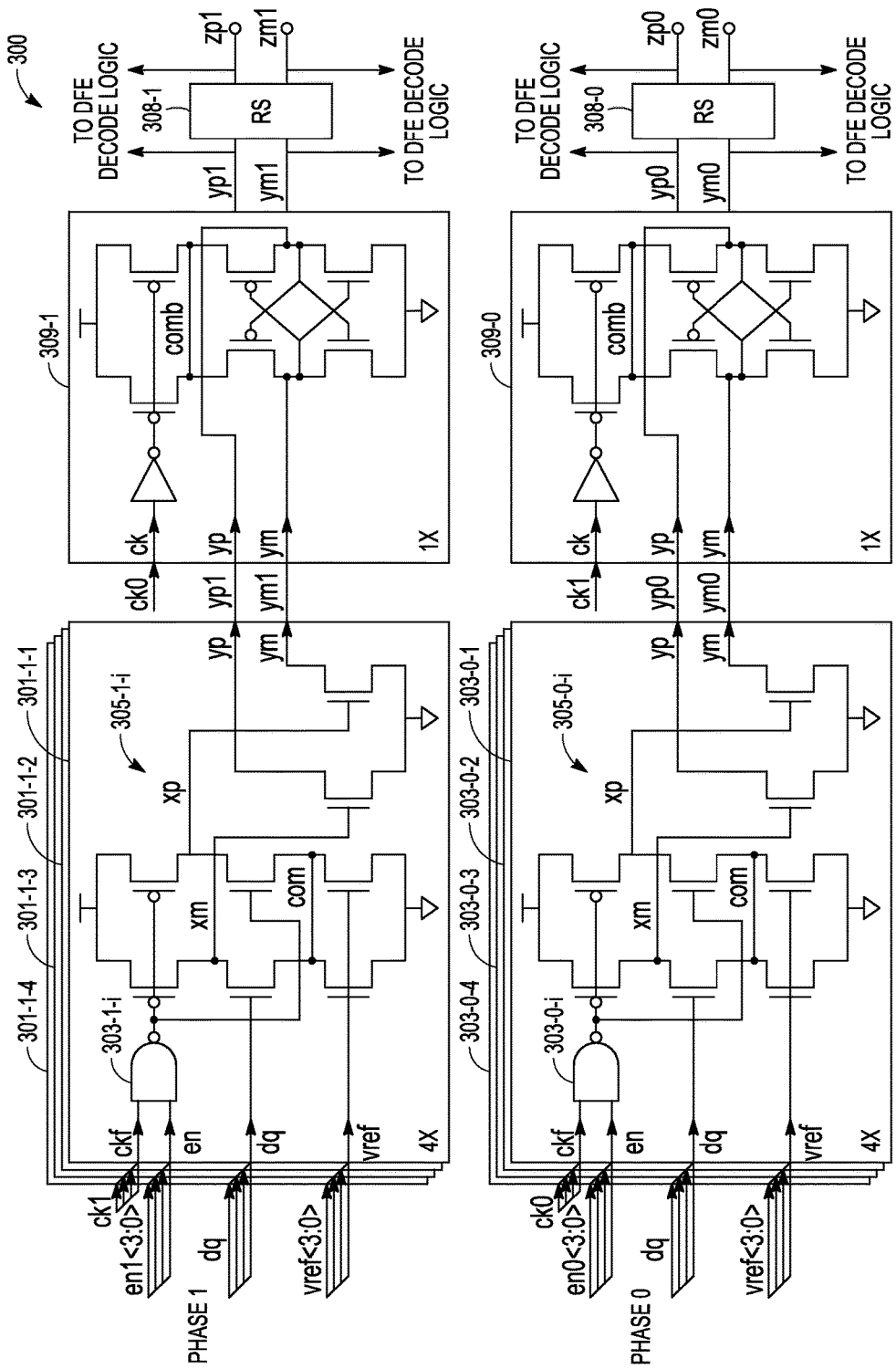
FIG. 3 is a schematic of an example two-phase receiver with a two-tap, four-voltage reference decision feedback equalization front end, according to various embodiments.

FIG. 3 is a schematic of an embodiment of an example 2-phase receiver with a 2-tap, 4-Vref DFE front end. With multiple independent Vref signals, the circuit may host an unrestricted, high speed DFE algorithm. The design of the 2-phase receiver can be viewed as the design of DFE circuit 100 of FIG. 1 generalized to the 2-phase, 2-tap circuit shown in FIG. 3. The number of front end circuits (per phase) and the number of Vref signals grows exponentially with the number of DFE taps. For the 2-tap circuit, four reference (Vref) signals can be used. For each data latch, the clock is gated by separate enable signals. A DFE algorithm can then be implemented by decoding the clock enable signals based on previous bits (yp0, ym0, yp1, ym1) and comparing the input signal to predefined reference signals. Set-reset latches restore the return-to-zero signals output by the data latch to digital signals. Decoding the clock enable signals can use both the return-to-zero outputs of the other phase (for the most recent bit) and the RS outputs of the same phase (for the second most recent bit).

FIG. 3 illustrates a DFE circuit 300 having a phase 0 and a phase 1 with each phase having four front end circuits. Phase 1 includes front end circuits 301-1-1, 301-1-2, 301-1-3, and 301-1-4, where each front end circuits **301-1-*i* includes a NAND gate 303-1-*i* and data latch 305-1-*i*, where i=1 . . . 4. Each of front end circuits 301-1-1, 301-1-2**, 301-1-3, and 301-1-4 can be arranged to receive a clock signal for phase 1, ck1 and a data signal dq. DFE circuit 300 can be arranged to receive a set of enable signals en1<3:0> with a different one of the set of enable signals to a different one of the front end circuits 301-1-1, 301-1-2, 301-1-3, and 301-1-4. DFE circuit 300 can also be arranged to receive a set of reference signals vref<3:0> with a different one of the set of reference signals to a different one of the front end circuits 301-1-1, 301-1-2, 301-1-3, and 301-1-4. Each of the front end circuits 301-1-1, 301-1-2, 301-1-3 having outputs, yp and ym, where the yps and yms of the front end circuits 301-1-1, 301-1-2, 301-1-3, and 301-1-4 can be wired together to provide two outputs yp1 and ym1. The two outputs, yp1 and ym1, from the combined operation of front end circuits 301-1-1, 301-1-2, 301-1-3, and 301-1-4 can be provided to a second stage 309-1, where a phase zero clock, ck0, can also be input to second stage 309-1. Second stage 309-1 provides return-to-zero outputs yp1 and ym1. The return-to-zero outputs, yp1 and ym1, are provided to set-reset latch 308-1, which provides the digital levels, zp1 and zm1.

Phase 0 includes front end circuits 301-0-1, 301-0-2, 301-0-3, and 301-0-4, where each front end circuits 301-0-$i$ includes a NAND gate 303-0-$i$ and data latch 305-0-$i$, where i=1 . . . 4. Each front end circuit 301-0-1, 301-0-2, 301-0-3, and 301-0-4 can be arranged to receive a clock signal for phase 0, ck0 and the data signal dq. DFE circuit 300 can be arranged to receive a set of enable signals en0<3:0> with a different one of the set of enable signals to a different one of the front end circuits 301-0-1, 301-0-2, 301-0-3, and 301-0-4. DFE circuit 300 can also be arranged to receive the set of reference signals vref<3:0> with a different one of the set of reference signals to a different one of the front end circuits 301-0-1, 301-0-2, 301-0-3, and 301-0-4. Each of the front end circuits 301-0-1, 301-0-2, 301-0-3 having outputs, yp and ym, where the yps and yms of the front end circuits 301-0-1, 301-0-2, 301-0-3, and 301-0-4 can be wired together to provide two outputs yp0 and ym0. The two outputs, yp0 and ym0, from the combined operation of front end circuits 301-0-1, 301-0-2, 301-0-3, and 301-0-4 can be provided to a second stage 309-0, where the phase one clock, ck1, can also be input to second stage 309-0. Second stage 309-0 provides return-to-zero outputs yp0 and ym0. The return-to-zero outputs, yp0 and ym0, are provided to set-reset latch 308-0, which provides the digital levels, zp0 and zm0.

The 2-tap feedback for the DEF circuit 300 based on previous bits at the output of DFE circuit are provided as the sets of enable signals, en 1<3:0> and en0<3:0>. The sets of enable signals, en1<3:0> and en0<3:0>, are generated by a DFE decode algorithm. The DFE decode algorithm can be generated by DFE decode logic circuits with inputs (yp0, ym0, zp0, zm0) and (yp1, ym1, zp1, zm1) to provide outputs en1<3:0> and en0<3:0>. The inputs yp0, ym0, zp0, zm0 can be complements of yp1, ym1, zp1, zm1, respectively. By applying two inputs to a set of nor gates, the set en1<3:0> can be generated as en1<0>=nor (zm1, yp0), en1<1>=nor (zp1, ym0), en1<2>=nor (zp1, yp0), and en1<3>=nor (zm1, ym0). By applying two inputs to a set of nor gates, the set en0<3:0> can be generated as en0<0>=nor (zm0, yp1), en0<1>=nor (zp0, ym1), en0<2>=nor (zp0, yp1), and en0<3>=nor (zm0, ym1). The sets of enable signals, en1<3:0> and en0<3:0>, are used to enable comparison of an input data signal with the set of reference voltages vref<3:0>, where the pattern "10" is associated with vref<0>, the pattern "01" is associated with vref<1>, the pattern "00" is associated with vref<2>, and the pattern "11" is associated with vref<3>.

Figure 4:
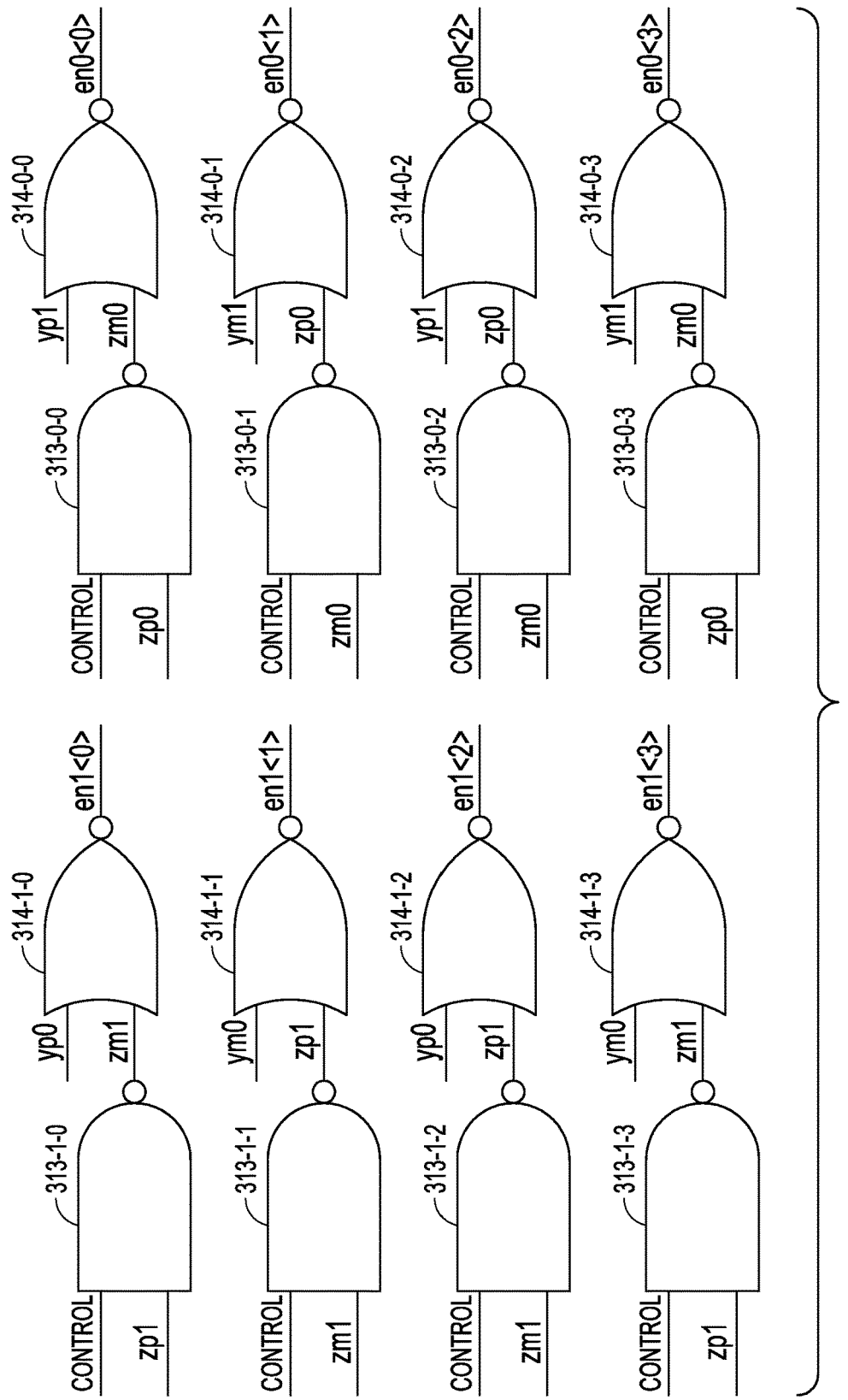
FIG. 4 is a schematic of an example set of logic circuits to implement the feedback part of the DFE algorithm, according to various embodiments.

FIG. 4 is a schematic of an embodiment of an example set of logic circuits to implement a DFE algorithm. As noted above, each enable signal of a set of enable signals can be generated using a nor logic operation. One of the inputs to each nor gate shown in FIG. 4 can be provided via a nand gate using a control signal input, which can allow for the timing between the inputs of the nor gates to be aligned, in which the control and the other input generate the complement of the input. An example for the DFE decode logic associated with FIG. 3, the sets of enable signals, en1<3:0> can be provided by nor gates 314-1-0, 314-1-1, 314-1-2, 314-1-3 in paired combination with nand gates 313-1-0, 313-1-1, 313-1-2, 313-1-3, respectively, operating on (yp0, ym0, zp1, zm1). The sets of enable signals, en0<3:0> can be provided by nor gates 314-0-0, 314-0-1, 314-0-2, 314-0-3 in paired combination with nand gates 313-0-0, 313-0-1, 313-0-2, 313-0-3, respectively, operating on (yp1, ym1, zp0, zm0).

Figure 5:
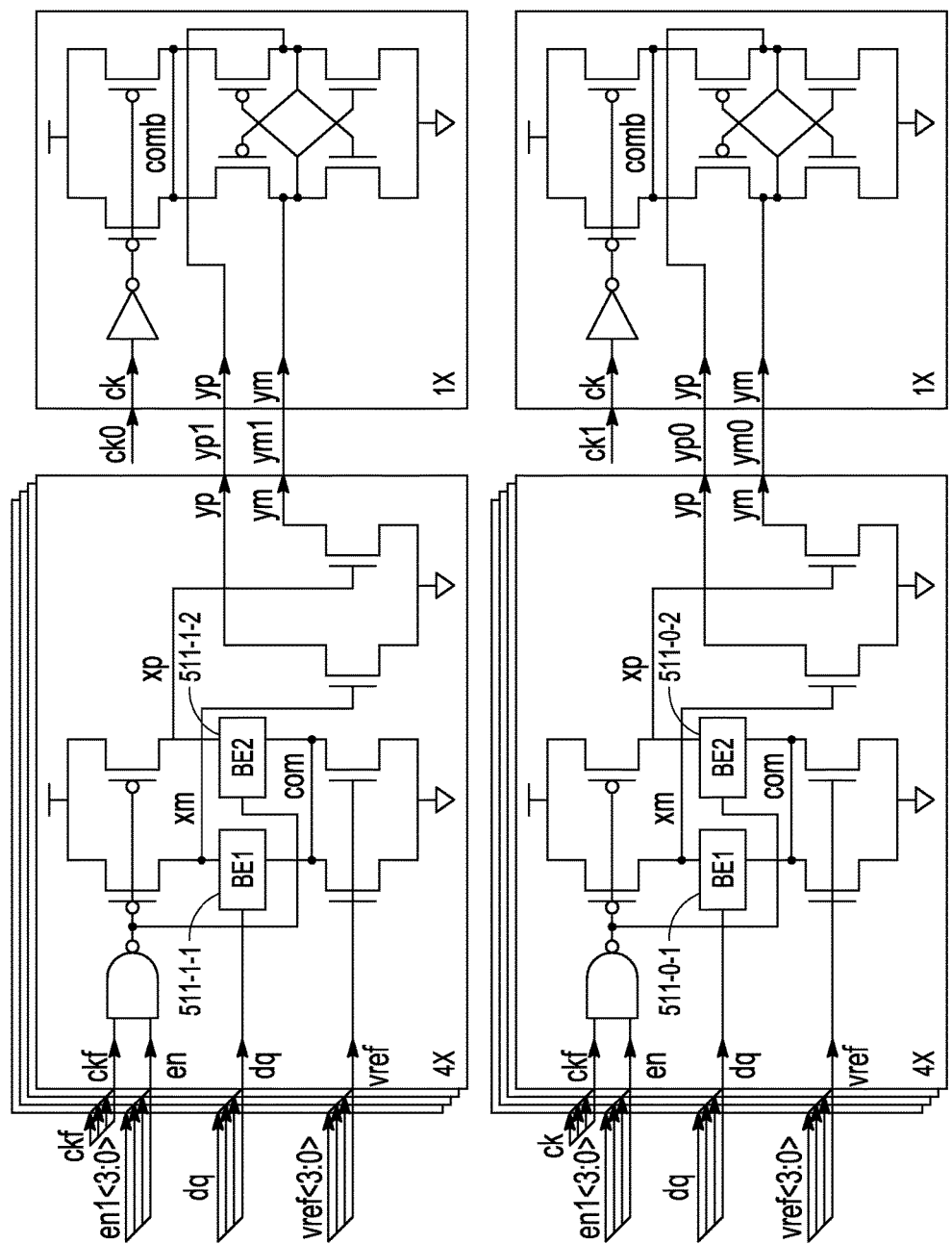
FIG. 5 is a schematic of an example generalization to the decision feedback equalization circuit of FIG. 3, according to various embodiments.

Reference voltages allow ease of the use of calculated DFE coefficients directly. However, implementation of a DFE circuit with respect to previous bits is not limited to the use of reference voltages. Any kind of static, calibrated analog unbalance can be used. FIG. 5 is a schematic of an embodiment of an example generalization to the DFE circuit 300 of FIG. 3 in which balancing elements BE1 and BE2 are used for comparison of data input. For example, balancing elements 511-0-1 and 511-0-2 and balancing elements 511-1-1 and 511-1-2 can be transistors that have different characteristics in different front end circuits. Within a front end circuits, balancing elements 511-0-1 and 511-0-2 may be structured with identical characteristics to balancing elements 511-1-1 and 511-1-2 or characteristic having a known relationship to provide for comparison of input data signal at different levels among the set of front end circuits.

The architecture of FIGS. 1-5 can provide a fast and reliable data receiver with DFE circuit. However, circuit complexity may affect the practical number of taps that may be implemented. The number of front end circuits grows exponentially with the number of DFE taps required. In a 3-tap, 8-vref implementation the parasitic capacity of the return-to-zero nodes (yp0, ym0, yp1, ym1) may limit how fast the circuit can operate. In addition, the multiple Vref structure may be best suited for 1 or 2 tap DFE configurations, which can be very efficient for compensating the inherent low pass characteristic of a data channel.

Figure 6:
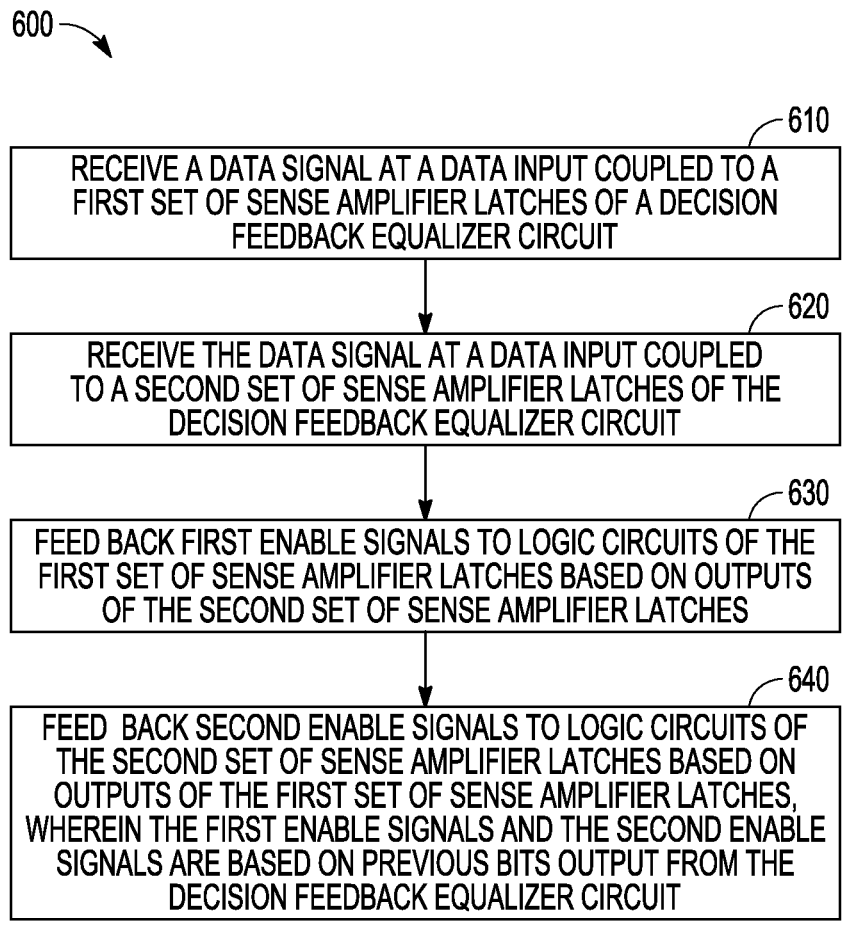
FIG. 6 is a flow diagram of features of a method of operating an apparatus having a decision feedback equalization receiver, according to various embodiments.

FIG. 6 is a flow diagram of features of an embodiment of an example method of operating an apparatus having a data receiver with a decision feedback equalization circuit. At 610, a data signal is received at a data input coupled to a first set of sense amplifier latches of a decision feedback equalizer circuit. Each sense amplifier latch of the first set can be coupled to a respective reference input of a set of the reference inputs, and each sense amplifier latch of the first set can be coupled by a respective logic circuit to receive a first clock signal in response to enablement by the respective logic circuit.

At 620, the data signal is received at the data input coupled to a second set of sense amplifier latches of the decision feedback equalizer circuit. Each sense amplifier latch of the second set can be coupled to a respective reference input of the set of the reference inputs, and each sense amplifier latch of the second set can be coupled by a respective logic circuit to receive a second clock signal in response to enablement by the respective logic circuit. In an embodiment, each of the first set of sense amplifier latches and the second set of sense amplifier latches has four sense amplifier latches.

At 630, first enable signals are fed back to logic circuits of the first set of sense amplifier latches based on outputs of the second set of sense amplifier latches. At 640, second enable signals are fed back to logic circuits of the second set of sense amplifier latches based on outputs of the first set of sense amplifier latches, wherein the first enable signals and the second enable signals are based on previous bits output from the decision feedback equalizer circuit. Feeding back the second enable signals can include feeding back outputs of logical gates, where each logical gate has a different pair of inputs, with the pair of inputs having one input from a return-to-zero output associated with the second clock and one input from an output associated with an output of the first set of sense amplifier latches. Feeding back first enable signals and feeding back second enable signals can include feeding back the first enable signals and feeding back the second enable signals within one unit of information from receiving the data signal.

Variations of method 600 or methods similar to method 600 can include a number of different embodiments that may or may not be combined depending on the application of such methods and/or the architecture of systems in which such methods are implemented.

In various embodiments, a clocked receiver comprises: a set of data latches to couple to different analog unbalances, the analog unbalances being static relative to an input signal data rate; and a clock decoder structured to activate only one data latch of the set corresponding to one analog unbalance of the analog unbalances based on a value of a previous bit output from the clocked receiver. The different analog unbalances can be different reference voltages. The set of data latches can be a set of identical data latches. Outputs of the data latches can be coupled to the clock decoder such that only an active latch of the set drives a final output. The clock decoder, structured to activate only one data latch of the set based on the value of the previous bit, can be arranged to provide digital feedback signals to the set of data latches within one unit of information.

In various embodiments, a decision feedback equalization circuit comprises: a data input to receive a data signal; a clock input to receive a clock signal; a complementary clock input to receive a complement of the clock signal; a set of reference inputs; a first set of sense amplifier latches; a second set of sense amplifier latches; and feedback loops. Each sense amplifier latch of the first set can be coupled to the data input and can be coupled to a respective reference input of the set of the reference inputs. Each sense amplifier latch of the first set can be coupled by a respective logic circuit to receive the clock signal in response to enablement by the respective logic circuit. Each sense amplifier latch of the second set can be coupled to the data input and can be coupled to a respective reference input of the set of the reference inputs, and each sense amplifier latch of the second set can be coupled by a respective logic circuit to receive the complement of the clock signal in response to enablement by the respective logic circuit. The feedback loops can be arranged to provide first enable signals to the logic circuits of the first set of sense amplifier latches based on outputs of the second set of sense amplifier latches and to provide second enable signals to the logic circuits of the second set of sense amplifier latches based on outputs of the first set of sense amplifier latches. The outputs of the first set and the second set can correspond to previous bits output from the decision feedback equalizer circuit.

Variations of a decision feedback equalization circuit or circuits similar decision feedback equalization circuit can include a number of different embodiments that may or may not be combined depending on the application of such circuits and/or the architecture of systems in which such circuits are implemented. Such a decision feedback equalization circuit or similar decision feedback equalization circuit can have set-reset latches to restore signals output by the first and second set of sense amplifier latches to digital signals. The signals output by the first and second set of sense amplifier latches can be return-to-zero signals. The feedback loops can provide the first enable signals and the second enable signals within one unit of information. Each of the first set of sense amplifier latches and the second set of sense amplifier latches can have a number of sense amplifier latches equal to $2^N$, where N is the number of taps of the decision feedback equalization circuit. The set of reference inputs can be a set of $2^N$ reference inputs. In an embodiment, N can equal one.

In various embodiments, each sense amplifier latch of the first set of sense amplifier latches and the second set of sense amplifier latches can include a comparator to compare the data signal and a reference voltage input from the respective reference input to the respective sense amplifier latch in response to enablement of the respective sense amplifier latch. The reference voltage can be static. Non-enabled sense amplifier latches of the first set and the second set of sense amplifier latches can be in a high impedance state. The set of reference inputs can be a set having one reference input, where each sense amplifier latch of the first set of sense amplifier latches has a balancing element coupled to the one reference input to compare with the data signal, with the balancing element of each sense amplifier latch being different from the balancing element of the other sense amplifier latches of the first set of sense amplifier latches.

In various embodiments, an apparatus comprises: a data bus and a number of memory devices coupled to the data bus. Each memory device can include a number of decision feedback equalization circuit, where each decision feedback equalization circuit can include: a data input to receive a data signal; a first clock input to receive a first clock signal; a second clock input to receive a second clock signal; a set of reference inputs; a first set of sense amplifier latches; a second set of sense amplifier latches; and feedback loops. Each sense amplifier latch of the first set can be coupled to the data input and can be coupled to a respective reference input of the set of the reference inputs. Each sense amplifier latch of the first set can be coupled by a respective logic circuit to receive the first clock signal in response to enablement by the respective logic circuit. Each sense amplifier latch of the second set can be coupled to the data input and can be coupled to a respective reference input of the set of the reference inputs. Each sense amplifier latch of the second set can be coupled by a respective logic circuit to receive the second clock signal in response to enablement by the respective logic circuit. The feedback loops can be arranged to provide first enable signals to the logic circuits of the first set of sense amplifier latches based on outputs of the second set of sense amplifier latches and to provide second enable signals to the logic circuits of the second set of sense amplifier latches based on outputs of the first set of sense amplifier latches. The outputs of the first set and the second set can include outputs corresponding to previous bits output from the decision feedback equalizer circuit.

Variations of such an apparatus or similar apparatus can include a number of different embodiments that may or may not be combined depending on the application of such circuits and/or the architecture of systems in which such apparatus are implemented. Such apparatus can have each of the first set of sense amplifier latches and the second set of sense amplifier latches structured to have a number of sense amplifier latches equal to $2^N$, where N is the number of taps of the decision feedback equalization circuit, and the set of reference inputs is a set of $2^N$ reference inputs. The apparatus can be structured with N=2. In various embodiments, the second enable signals to the logic circuits of the second set of sense amplifier latches can be outputs of logical gates, where each logical gate has a different pair of inputs. The pair of inputs can have one input from a return-to-zero output associated with the second phase clock and one input from an output associated with an output of the first set of sense amplifier latches.

Figure 7:
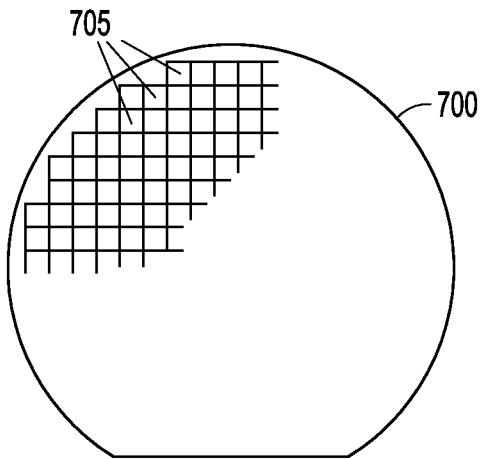
FIG. 7 illustrates an example of a wafer arranged to provide multiple electronic components, according to various embodiments.

FIG. 7 illustrates an embodiment of an example of a wafer 700 arranged to provide multiple electronic components. Wafer 700 can be provided as a wafer in which a number of dice 705 can be fabricated. Alternatively, wafer 700 can be provided as a wafer in which the number of dice 705 have been processed to provide electronic functionality and are awaiting singulation from wafer 700 for packaging. Wafer 700 can be provided as a semiconductor wafer, a semiconductor on insulator wafer, or other appropriate wafer for processing electronic devices such as an integrated circuit chips.

Using various masking and processing techniques, each die 705 can be processed to include functional circuitry such that each die 705 is fabricated as an integrated circuit with the same functionality and packaged structure as the other dice on wafer 700. Alternatively, using various masking and processing techniques, various sets of dice 705 can be processed to include functional circuitry such that not all of the dice 705 are fabricated as an integrated circuit with the same functionality and packaged structure as the other dice on wafer 700. A packaged die having circuits integrated thereon providing electronic capabilities is herein referred to as an integrated circuit (IC).

Wafer 700 can comprise multiple dice 705. Each die 705 of the multiple dice can be structured as an electronic device including a data receiver having a decision feedback equalization circuit, where the decision feedback equalization circuit can be structured similar or identical to decision feedback equalization circuits associated with any of FIGS. 1-6. The electronic device can be a memory device.

Figure 8:
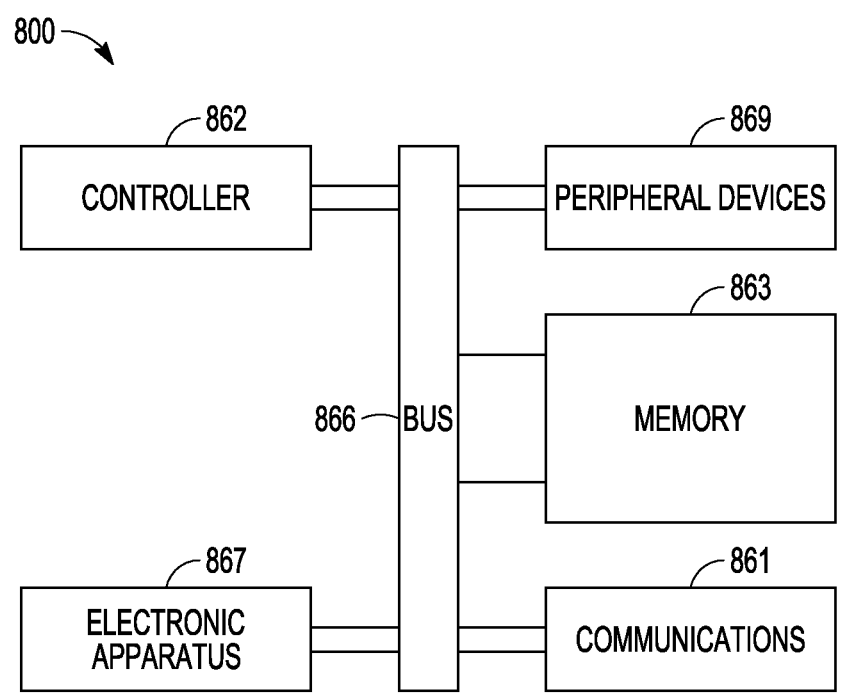
FIG. 8 is a block diagram of an example system that includes a decision feedback equalization receiver, according to various embodiments.

FIG. 8 shows a block diagram of an embodiment of an example system 800 that includes one or more apparatus having a decision feedback equalization circuit as taught herein. System 800 can include a controller 862 operatively coupled to memory 863. System 800 can also include communications 861, an electronic apparatus 867, and peripheral devices 869. One or more of controller 862, memory 863, electronic apparatus 867, communications 861, or peripheral devices 869 can be in the form of one or more ICs.

A bus 866 provides electrical conductivity between and/or among various components of system 800. In an embodiment, bus 866 can include an address bus, a data bus, and a control bus, each independently configured. In an alternative embodiment, bus 866 can use common conductive lines for providing one or more of address, data, or control, the use of which is regulated by controller 862. Controller 862 can be in the form or one or more processors. Bus 866 may be part of a network with communications controlled by controller 862 and/or communications 861.

Electronic apparatus 867 may include additional memory. Memory in system 800 may be constructed as one or more types of memory such as, but not limited to, dynamic random access memory (DRAM), static random access memory (SRAM), synchronous dynamic random access memory (SDRAM), synchronous graphics random access memory (SGRAM), double data rate dynamic ram (DDR), double data rate SDRAM, and magnetic based memory.

Peripheral devices 869 may include displays, imaging devices, printing devices, wireless devices, additional storage memory, and control devices that may operate in conjunction with controller 862. In various embodiments, system 800 can include, but is not limited to, fiber optic systems or devices, electro-optic systems or devices, optical systems or devices, imaging systems or devices, and information handling systems or devices such as wireless systems or devices, telecommunication systems or devices, and computers.

Having all the high speed moving parts of the decision feedback loop driven by a few simple CMOS gates effectively guarantees optimal performance for a given process. No analog circuit can react faster while process variability has no direct effect on performance. Using reference voltages allows ease of use of calculated DFE coefficients directly. Unlike a loop unrolled solution, the decision-based clock decoder activates only one data latch, thus power does not increase with the complexity of the circuit.

Although specific embodiments have been illustrated and described herein, it will be appreciated by those of ordinary skill in the art that other arrangements derived from the teachings herein may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. A decision feedback equalization circuit comprising:
    a data input to receive a data signal;
    a clock input to receive a clock signal;
    a complementary clock input to receive a complement of the clock signal;
    a set of reference inputs;
    a first set of sense amplifier latches, each sense amplifier latch of the first set coupled to the data input and coupled to a respective reference input of the set of the reference inputs, each sense amplifier latch of the first set coupled by a respective logic circuit to receive the clock signal in response to enablement by the respective logic circuit;
    a second set of sense amplifier latches, each sense amplifier latch of the second set coupled to the data input and coupled to a respective reference input of the set of the reference inputs, each sense amplifier latch of the second set coupled by a respective logic circuit to receive the complement of the clock signal in response to enablement by the respective logic circuit; and
    feedback loops to provide first enable signals to the logic circuits of the first set of sense amplifier latches based on outputs of the second set of sense amplifier latches and to provide second enable signals to the logic circuits of the second set of sense amplifier latches based on outputs of the first set of sense amplifier latches, the outputs of the first set and the second set corresponding to previous bits output from the decision feedback equalizer circuit.

2. The decision feedback equalization circuit of claim 1, wherein the decision feedback equalization circuit has set-reset latches to restore signals output by the first and second set of sense amplifier latches to digital signals.

3. The decision feedback equalization circuit of claim 2, wherein the signals output by the first and second set of sense amplifier latches are return-to-zero signals.

4. The decision feedback equalization circuit of claim 1, wherein the feedback loops provide the first enable signals and the second enable signals within one unit of information.

5. The decision feedback equalization circuit of claim 1, wherein each of the first set of sense amplifier latches and the second set of sense amplifier latches has a number of sense amplifier latches equal to $2^N$, where N is the number of taps of the decision feedback equalization circuit.

6. The decision feedback equalization circuit of claim 5, wherein the set of reference inputs is a set of $2^N$ reference inputs.

7. The decision feedback equalization circuit of claim 5, wherein N=1.

8. The decision feedback equalization circuit of claim 1, wherein each sense amplifier latch of the first set of sense amplifier latches and the second set of sense amplifier latches includes a comparator to compare the data signal and a reference voltage input from the respective reference input to the respective sense amplifier latch in response to enablement of the respective sense amplifier latch.

9. The decision feedback equalization circuit of claim 8, wherein the reference voltage is static.

10. The decision feedback equalization circuit of claim 8, wherein non-enabled sense amplifier latches of the first set and the second set of sense amplifier latches are in a high impedance state.

11. The decision feedback equalization circuit of claim 1, wherein the set of reference inputs is a set having one reference input, each sense amplifier latch of the first set of sense amplifier latches has a balancing element coupled to the one reference input to compare with the data signal, the balancing element of each sense amplifier latch being different from the balancing element of the other sense amplifier latches of the first set of sense amplifier latches.

12. An apparatus comprising:
   a data bus; and
   a number of memory devices coupled to the data bus, each memory device including a number of decision feedback equalization circuit, each decision feedback equalization circuit including:
      a data input to receive a data signal;
      a first clock input to receive a first clock signal;
      a second clock input to receive a second clock signal;
      a set of reference inputs;
      a first set of sense amplifier latches, each sense amplifier latch of the first set coupled to the data input and coupled to a respective reference input of the set of the reference inputs, each sense amplifier latch of the first set coupled by a respective logic circuit to receive the first clock signal in response to enablement by the respective logic circuit;
      a second set of sense amplifier latches, each sense amplifier latch of the second set coupled to the data input and coupled to a respective reference input of the set of the reference inputs, each sense amplifier latch of the second set coupled by a respective logic circuit to receive the second clock signal in response to enablement by the respective logic circuit; and
      feedback loops to provide first enable signals to the logic circuits of the first set of sense amplifier latches based on outputs of the second set of sense amplifier latches and to provide second enable signals to the logic circuits of the second set of sense amplifier latches based on outputs of the first set of sense amplifier latches, the outputs of the first set and the second set including outputs corresponding to previous bits output from the decision feedback equalizer circuit.

13. The apparatus of claim 12, wherein each of the first set of sense amplifier latches and the second set of sense amplifier latches has a number of sense amplifier latches equal to $2^N$, where N is the number of taps of the decision feedback equalization circuit, and the set of reference inputs s a set of $2^N$ reference inputs.

14. The apparatus of claim 13, wherein N=2.

15. The apparatus of claim 14, wherein the second enable signals to the logic circuits of the second set of sense amplifier latches are outputs of logical gates, each logical gate having a different pair of inputs, the pair of inputs having one input from a return-to-zero output associated with the second phase clock and one input from an output associated with an output of the first set of sense amplifier latches.

16. A method comprising:
   receiving a data signal at a data input coupled to a first set of sense amplifier latches of a decision feedback equalizer circuit, each sense amplifier latch of the first set coupled to a respective reference input of a set of the reference inputs, each sense amplifier latch of the first set coupled by a respective logic circuit to receive a first clock signal in response to enablement by the respective logic circuit;
   receiving the data signal at the data input coupled to a second set of sense amplifier latches of the decision feedback equalizer circuit, each sense amplifier latch of the second set coupled to a respective reference input of the set of the reference inputs, each sense amplifier latch of the second set coupled by a respective logic circuit to receive a second clock signal in response to enablement by the respective logic circuit;
   feeding back first enable signals to the logic circuits of the first set of sense amplifier latches based on outputs of the second set of sense amplifier latches; and
   feeding back second enable signals to the logic circuits of the second set of sense amplifier latches based on outputs of the first set of sense amplifier latches, wherein the first enable signals and the second enable signals are based on previous bits output from the decision feedback equalizer circuit.

17. The method of claim 16, wherein each of the first set of sense amplifier latches and the second set of sense amplifier latches has four sense amplifier latches.

18. The method of claim 17, wherein feeding back second enable signals includes feeding back outputs of logical gates, each logical gate having a different pair of inputs, the pair of inputs having one input from a return-to-zero output associated with the second clock and one input from an output associated with an output of the first set of sense amplifier latches.

19. The method of claim 16, wherein feeding back first enable signals and feeding back second enable signals includes feeding back the first enable signals and feeding back the second enable signals within one unit of information from receiving the data signal.

* * * * *